United States Patent [19]

Mehrotra

[11] Patent Number: 5,719,507
[45] Date of Patent: Feb. 17, 1998

[54] LOGIC GATE HAVING TRANSMISSION GATE FOR ELECTRICALLY CONFIGURABLE DEVICE MULTIPLEXER

[75] Inventor: Alok Mehrotra, Los Gatos, Calif.

[73] Assignee: Xilinx, Inc., San Jose, Calif.

[21] Appl. No.: 803,686

[22] Filed: Feb. 24, 1997

Related U.S. Application Data

[63] Continuation of Ser. No. 542,366, Oct. 12, 1995, abandoned.

[51] Int. Cl.$^6$ ............................................. H03K 19/0948
[52] U.S. Cl. ............................................. 326/113; 326/108
[58] Field of Search .............................. 326/88, 105, 108, 326/83, 112, 113

[56] References Cited

U.S. PATENT DOCUMENTS

| | | | |
|---|---|---|---|
| 4,620,117 | 10/1986 | Fang | 326/113 |
| 4,835,418 | 5/1989 | Hsieh | 326/57 |
| 5,097,152 | 3/1992 | Kohda et al. | 326/83 |
| 5,130,704 | 7/1992 | Ogawa et al. | 326/105 |
| 5,418,480 | 5/1995 | Hastie et al. | 326/113 |
| 5,467,032 | 11/1995 | Lee | 326/88 |
| 5,488,316 | 1/1996 | Freeman et al. | 326/105 |

OTHER PUBLICATIONS

Wakerly, John F.; "Digital Design, Principles and Practices"; copyright 1989 by John F. Wakerly; p. 231.

Weste et al.; "Principles of CMOS VLSI Design, A Systems Perspective"; copyright 1988 by AT&T Bell Laboratories, Inc. and Kamran Eshraghian; p. 55.

Primary Examiner—Edward P. Westin
Assistant Examiner—Benjamin D. Driscoll
Attorney, Agent, or Firm—Edel M. Young; Clifton L. Anderson

[57] ABSTRACT

A 4×1 multiplexer for an electrically configurable device uses novel logic gates to logically combine outputs from two SRAM memory cells to control pass gates between the multiplexer signal inputs and a multiplexer output. Each logic gate has three transistors. A complementary NMOS/PMOS pair of transistors defines a transmission gate. The gate of the NMOS transistor defines a first logic-gate input, while the gate of the PMOS transistor defines a second logic-gate input. Their sources are coupled and cooperatively define a third logic-gate input. Their drains are coupled and cooperatively define the logic-gate output. A third transistor, with its gate tied to the third input, couples the logic-gate output to ground when the transmission gate is OFF. The first and second logic-gate inputs are respectively coupled to complementary outputs of one memory cell, while the third logic gate input is coupled to an output of the other memory cell. The memory cells are "pumped" so that their output voltages are at least an NMOS transistor threshold voltage above the maximum signal level at the multiplexer signal inputs. When a logic gate activates its respective pass gate, the pass gate activation voltage is sufficiently high that the pass gate output has the same maximum voltage as the pass gate input. This permits agile tracking of the selected input signal by the multiplexer input, providing high device performance. The logic gates do not require power to be routed to them and require only three transistors each, compared to four for conventional NOR gates. Thus, the present invention achieves high performance while conserving precious integrated circuit area and reducing routing complexity.

3 Claims, 1 Drawing Sheet

LOGIC GATE HAVING TRANSMISSION GATE FOR ELECTRICALLY CONFIGURABLE DEVICE MULTIPLEXER

This application is a continuation of application Ser. No. 08/542,366, filed Oct. 12, 1995, abandoned.

BACKGROUND OF THE INVENTION

The present invention relates to electrically configurable integrated circuits and, more particularly, to multiplexers in such devices. A major objective of the present invention is to provide a high performance 4×1 electrically configurable device multiplexer with reduced requirements for integrated circuit area and routing complexity.

Much of modern progress is associated with the increasing functionality and speed of integrated circuits. When produced in large quantities, integrated circuits are sufficiently inexpensive that computers, instruments, and consumer products incorporating them are within the reach of everyone. However, very high start-up costs, including research, manufacturing facilities, design, processing, and testing, can be prohibitive for small volume applications. Low volume runs are important, not only for certain specialized applications, but as intermediate steps in the development of integrated circuits eventually destined for large volume production.

Electrically configurable devices (ECDs) can facilitate low cost product development because they allow in-circuit configuration and reconfiguration. If a circuit design defect is detected, an ECD can be reconfigured by software to correct the defect. Once a circuit design is accepted, an updated configuration programmable read only memory (PROM), programmed with the proper configuration data, can be installed for convenient ECD configuration.

ECDs typically store configuration data in static random access memory (SRAM) cells. The values stored in these memory cells can be used, for example, to select among the inputs of a multiplexer for a source for the multiplexer output. In a rudimentary ECD multiplexer, true and false outputs of an SRAM cell control respective pass gates along respective signal input lines. The output of the respective pass gates are coupled to define the multiplexer output. The value stored in the SRAM cell determines which of the two inputs is coupled to the output.

One problem with such a multiplexer is that the output voltage of a pass gate cannot exceed the pass gate control voltage less a transistor voltage drop. If the control voltage and the maximum input voltage are the same, the maximum output signal of the pass gates is less than the maximum input voltage. The reduced maximum output voltage can cause problems with downstream devices, e.g., a low-threshold PMOS transistor driven by the pass gate can fail to turn off during a low-to-high transition in the pass gate output. While there are a number of ways this problem can be addressed, they all involve undesirable tradeoffs.

If a PMOS (active low) pass gate is used instead of the more conventional NMOS (active high) pass gate, the output maximum voltage can equal the input maximum voltage, but the output minimum voltage is higher than the input minimum voltage. With either type of pass gate, the voltage range of the pass gate output fails to match that of the pass gate input. Thus, whether the pass gate is PMOS or NMOS, the reduced voltage is problematic.

The loss of voltage range can be avoided by using transmission gates instead of pass gates. A transmission gate comprises parallel PMOS and NMOS pass gates. A control signal is applied directly to one of these transistors, while an inverter generates a complementary control signal that is applied to the other transistor. Thus, the transistors are switched ON and OFF concurrently. The PMOS transistor allows the voltage maximum to be preserved in the transmission gate output, while the NMOS transistor allows the voltage minimum to be preserved in the transmission gate output. Thus, the voltage range and device performance are maintained.

A disadvantage of the transmission gate is that it requires four transistors, two for the complementary pass gates and two for the inverter, instead of the single transistor required for a simple pass gate. In many cases, the additional complexity and consumption of scarce integrated circuit area involved in using the extra transistors is not acceptable. In addition, the transmission gate imposes a greater load on the driver due to the added PMOS gate.

In "pumped memory cell" approach to maintaining the voltage range of a pass gate output, the "ON" gate voltage can be set higher than the maximum signal voltage by at least the transistor voltage drop. In this case, the maximum output voltage equals the maximum input voltage for the multiplexer. The higher gate voltage can be provided by "pumping" the controlling memory cell by using a higher voltage as its power supply. For example, the input signal can vary between ground and VDD, and the memory cell source can be set at $VGG+V_T$, where $V_T$ is the n-channel pass-gate threshold. This pumped-memory-cell approach requires an additional power supply and moderately increased routing complexity, but provides the desired voltage range for the pass-gate output.

A more complex ECD multiplexer allows selection among four inputs based on the values in two memory cells. Pass gates along each of four signal inputs are controlled by logical combinations of memory cell outputs. Conceptually, four possible true and false pairs of outputs from the two memory cells are logically ANDed so that exactly one input line is selected as the output. Because of transistor-level considerations, the AND functions are typically implemented using NOR gates, taking advantage of the Boolean equivalence of a NOR of complements with the AND function. The outputs of the NOR gates control the pass gates of the signal lines. Similarly, a three-input multiplexer can be provided by omitting one signal line, one pass gate, and one NOR gate.

A typical NOR gate comprises four transistors. The two inputs to the NOR gate drive first and second PMOS (active low) transistors that are arranged in series between power and the NOR-gate output. The two NOR-gate inputs also drive third and fourth NMOS (active high) transistors that are arranged in parallel between ground and the NOR-gate output.

For this four-transistor NOR gate, the output voltage cannot exceed its supply voltage. Thus, to take advantage of pumped memory cells, the NOR gates must also have high-voltage supplies. Thus, the same high voltage supply (VGG) must be routed to the four NOR gates as well as to the two memory cells of a 4×1 multiplexer. The additional high-power routing makes the routing design process more complex and consumes valuable integrated circuit area. What is needed is a fast four-input ECD multiplexer with more modest high-voltage supply routing requirements.

SUMMARY OF THE INVENTION

The present invention utilizes a logic gate for which the output is coupled to one of the inputs through a transmission gate so that the logic high output voltage matches the voltage at that input. Thus, if the transmission gate is ON and that input is pumped, the logic gate output is also "pumped". The logic gate also includes a bypass transistor that couples the logic-gate output to ground when the transmission gate is OFF.

Accordingly, a four-input multiplexer comprises two memory cells, four logic gates, four signal inputs, four signal pass gates associated with the four signal inputs, and a multiplexer output commonly coupled to the four pass-gate outputs. Likewise, a three-input multiplexer is provided by omitting one signal input, one pass gate, and one logic gate. The memory cells can be pumped to provide the elevated logic-input voltages desired for controlling the signal pass gates.

Each logic gate has three inputs and an output. The function of the logic gate can be expressed as Q=(I AND J* AND K), where I, J, and K are the inputs, J* is the complement of J, and Q is the output of the logic gate. In the context of the multiplexer, inputs I and J are coupled to complementary inputs of the same memory cell. The K input is coupled to an output of the other memory cell. In the context of the four-input multiplexer, the inputs I and J are complementary so that the logic function reduces to the desired AND function, i.e., Q=I AND K.

Each logic gate includes three transistors. A first transistor is an NMOS transistor, the gate of which serves as the I input of the logic gate. A second transistor is a PMOS transistor, the gate of which serves as the J input of the logic gate. The first and second transistors are arranged as parallel pass gates: their sources are coupled, defining the K input of the logic gate; and their drains are coupled, defining the logic-gate output Q.

The control inputs of the parallel pair of complementary pass gates are driven in complementary fashion so that the pair of complementary pass-gates functions as a transmission gate. When ON, this transmission gate passes the full voltage range of the memory cell output coupled to the K input to the control input of the respective signal pass gate. As an alternative, a transmission gate with a local inverter can be used so that the J input is not required. In this case, the local inverter provides the control inputs to the second and third transistors.

The third transistor couples the logic gate output to ground when ON. This third transistor is arranged so that it is ON when the transmission gate is OFF and OFF when the transmission gate is ON. Without this third transistor, the logic gate output would be indeterminate when the transmission gate is OFF. With this third transistor, the logic gate output is logic low 0 when the transmission gate is OFF. Preferably, the third transistor is an NMOS transistor with its gate controlled by the J input. Alternatively, the third transistor can be a PMOS transistor with its gate controlled by the I input.

As indicated above, the logic function of each logic gate takes the form Q=I AND K. Each of the four logic gates has its I and K inputs tied to a respective combination of first and second memory cell outputs. Thus, the multiplexer selectively couples exactly one signal input line to the multiplexer output as a function of the combination of values stored in the two memory cells.

A major advantage of the present invention is that power does not need to be routed to the logic gates: neither VGG nor VDD is required by the logic gates. As with prior art NOR gates, outputs from two memory cells must be routed to each logic gate. The present invention requires an additional complementary memory cell output to be routed to each memory cell, but this is a minor consideration since that output is necessarily routed to neighboring logic gates and so is locally available. Thus, the present invention provides an advantage in routing complexity over the prior-art NOR-gate multiplexer design. This advantage applies not only when the memory cells are pumped, but also when they are driven by a standard voltage supply (VDD). In either the pumped or standard case, the maximum logic-gate output equals that of the voltage supply to the memory cells.

An additional benefit of the present invention is that each logic gate can be implemented using only three transistors instead of the four required for a conventional NOR gate. In sum, four transistors are saved per 4×1 multiplexer; three transistors are saved per 3×1 multiplexer. The reduction in transistor count and in routing complexity both contribute to a saving of precious integrated circuit area and a reduction in design complexity. These and other features and advantages of the present invention are apparent from the description below with reference to the following drawing.

DESCRIPTION OF THE PREFERRED EMBODIMENTS

Figure 1:
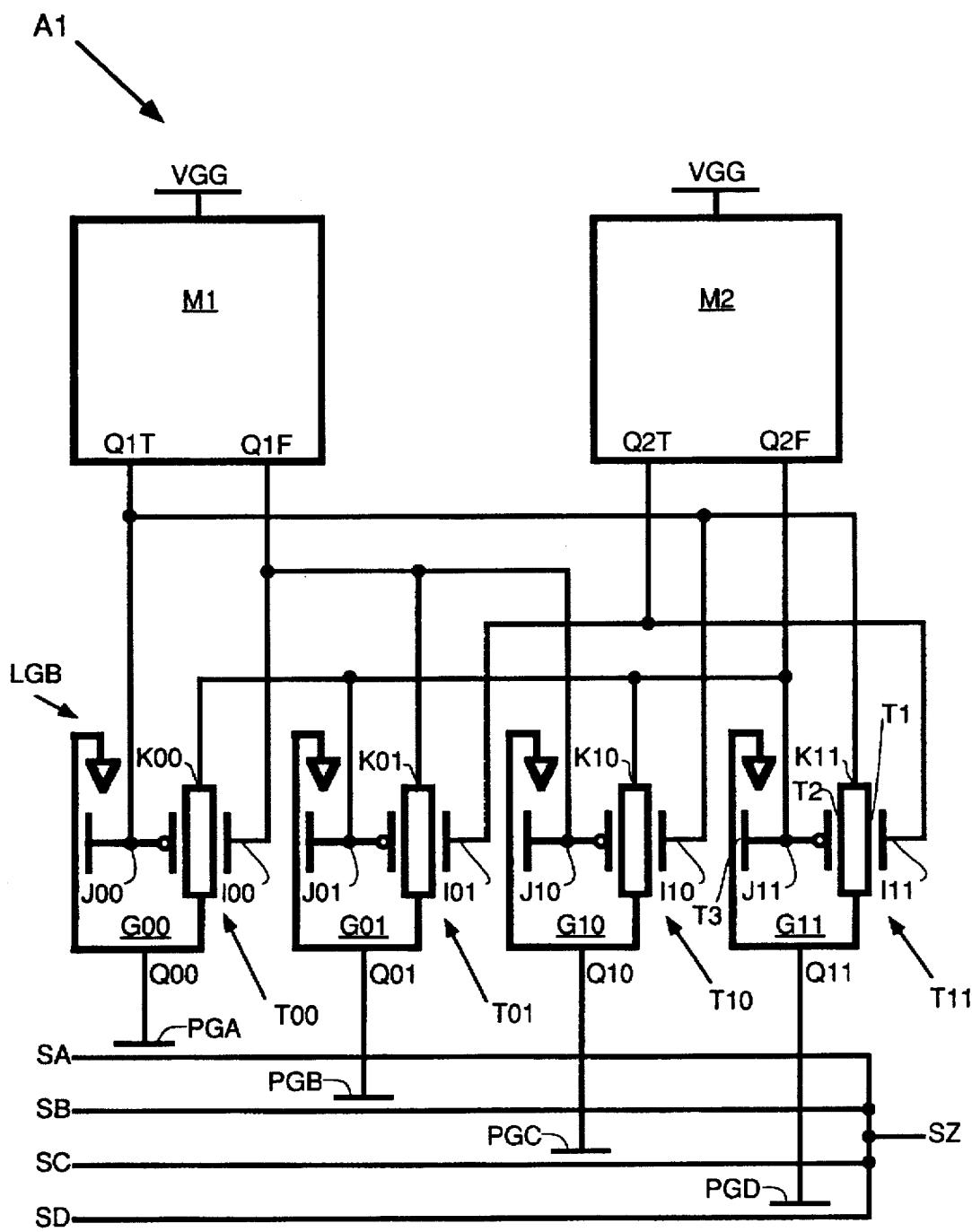
FIG. 1 is a schematic diagram of an ECD multiplexer in accordance with the present invention.

In accordance with the present invention, a 4×1 ECD multiplexer A1 has four signal inputs SA, SB, SC, and SD, and a signal output SZ. Associated with each signal input is a respective pass gate, PGA, PGB, PGC, and PGD, the outputs of which are all coupled to signal output SZ. Each pass gate is controlled by the output Q00, Q01, Q10, Q11, of a respective logic gate G00, G01, G10, G11, of a logic gate bank LGB so that only one signal pass gate is enabled at any given time. The outputs of the logic gates are determined by the values stored in memory cells M1 and M2. (The numeric suffixes of the gate referents indicate the memory cell values required to yield a positive output; thus the output of logic gate G01 is high when memory cell M1 stores a logic low 0 and memory cell M2 stores a logic high 1.)

Each logic gate has three inputs and an output. Logic gate G00 has inputs I00, J00, and K00, and output Q00. Logic gate G01 has inputs I01, J01, and K01, and output Q01. Logic gate G10 has inputs I10, J10, and K10, and output Q10. Logic gate G11 has inputs I11, J11, and K11, and output Q11. Each logic gate implements the logic function Q=I AND J* AND K. Since the I and J inputs are coupled to complementary outputs of the same memory cell, "I" equals "J*"; thus, the logic function reduces to the logical conjunction Q=I AND K of the first and third inputs to the logic gate.

For logic gate G00, input I00 is coupled to the false output Q1F of memory cell M1, input J00 is coupled to the true input Q1T of the same memory cell M1, and input K00 is coupled to the false output Q2F of the other memory cell M2. Thus, signal pass gate PGA is enabled when the values stored in M1 and M2 are both logic low 0.

For logic gate G01, input I01 is coupled to the true output Q2T of memory cell M2, input J01 is coupled to the false output Q2F of the same memory cell M2, and input K01 is coupled to the false output Q1F of the other memory cell M1. Thus, signal pass gate PGB is enabled when the values stored in M1 and M2 are respectively logic low 0 and logic high 1.

For logic gate G10, input I10 is coupled to the true output Q1T of memory cell M1, input J10 is coupled to the false output Q1F of the same memory cell M1, and input K10 is coupled to the false output Q2F of the other memory cell M2. Thus, signal pass gate PGC is enabled when the values stored in M1 and M2 are respectively logic high 1 and logic low 0.

For logic gate G11, input I11 is coupled to the true output Q2T of memory cell M2, input J11 is coupled to the false output Q2F of the same memory cell M2, and input YA1 is coupled to the true output Q1T of the other memory cell M1. Thus, signal pass gate PGD is enabled when the values stored in M1 and M2 are both logic high 1. Thus, the selective coupling of multiplexer output SZ to signal inputs SA, SB, SC, and SD is determined by the values stored in memory cells M1 and M2.

Each logic gate includes a respective transmission gate T00, T01, T02, T03. The incorporation of these transmission gates permits the signal-line pass gates to be controlled at the voltage levels output by the memory cells. In the present case, the memory cells are tied to power supply VGG, whereas signal input lines vary between ground at 0 volts (V) and VDD.

VGG should be at least a body-affected n-channel threshold higher than VDD. In the illustrated embodiment, VDD is 5 V and the threshold is about 1.2 V. Thus, VGG should be at least 6.2 V. Preferably, VGG is chosen to be about 6.4 V to provide at least 10% tolerance for manufacturing variations. With this arrangement, output signal SZ varies over the full 0–5 V range of the input-signals SA, SB, SC, and SD. If the VGG is less than one threshold above VDD, the present invention still provides an improvement over the prior art, but the improvement is not maximized.

The circuit structures of logic gates G00, G01, G10, and G11, are identical, so their common structure can be explained in full with detailed reference to logic gate G11. Logic gate G11 comprises three transistors: an NMOS transistor T1, a PMOS transistor T2, and an NMOS transistor T3. Transistors T1 and T2 are arranged in parallel to define transmission gate T11. The sources of transistors T1 and T2 define input K11 and their drains define output Q11. The gate of transistor T1 defines input I11, while the gate of transistor T2 defines input J11. Third transistor T3 has its source tied to ground and its drain coupled to output Q11. The gate of transistor T3 is coupled to input J11 so that output Q11 is pulled to ground when input J11 goes high. This pull down occurs when and only when transmission gate T11 is OFF.

When memory cell M2 stores a logic high 1, input I11 is high and input J11 is low. Thus, NMOS transistor T1 and PMOS transistor T2 turn ON, enabling transmission gate T11. Since the input of transmission gate T11 is the true output Q1T of memory cell M1, the voltage associated with the value stored in memory cell M1 is applied directly to signal pass gate PGD. If memory cell M1 stores a logic high 1, the voltage at the control input of signal pass gate PGD is equal to VGG since there is no voltage drop across PMOS transistor T2. If memory cell M1 stores a logic low 0, the control-gate voltage for signal pass gate PGD is equal to 0 V since there is no voltage rise across NMOS transistor T1.

When memory cell M2 stores a logic low 0, transmission gate T11 is OFF and transistor T3 is ON. In this case, the control input of signal pass gate PGD is coupled to ground through transistor T3. Thus, the control input of pass gate PGD is at VGG level when both memory cells store logic high 1s, and at ground level otherwise.

Likewise for logic gates G00, G01, and G10, when the I and K inputs are high, the full voltage of the memory cell output is applied to the respective signal pass gate, PGA, PGB, and PGC. Thus, when a signal pass gate is enabled, the signal pass-gate control voltage is at VGG level. Yet, VGG is not routed to the logic gates. Accordingly, a high-speed 4×1 multiplexer with simplified power routing and reduced transistor count (one less for each logic gate compared to a conventional NOR-gate implementation) is provided. While a 4×1 multiplexer is illustrated, a useful 3×1 multiplexer is provided by omitting one signal input and the respective pass gate and logic gate.

In the illustrated embodiment, VGG is 6.4 V and the signal lines vary between ground at 0 V and VDD at 5 V. In other embodiments, different voltages are used. Preferably, VGG exceeds the maximum signal voltage. Ideally, VGG exceeds the maximum signal voltage by at least one transistor voltage drop $V_T$. Although less preferable, the third transistor can be a PMOS device with its gate coupled to the second logic device input. Note that, as the terms are used herein, sources and drains are interchangeable.

While, in the preferred embodiment, the multiplexer is incorporated in an ECD device, in other embodiments the inputs to the logic gates can be changed during normal (non-configuration) device operation. Where the control inputs are not provided in complementary form, an inverter can be used to provide complementary inputs. Other embodiments employ the inventive logic gate in contexts other than multiplexers. These and other modifications to and variations upon the preferred embodiments are provided for by the present invention, the scope of which is limited only by the following claims.

What is claimed is:

1. A multiplexer comprising:

first and second memory cells, each having true and complement output terminals;

a plurality of pass transistors, each having an input terminal connected to a multiplexer input terminal and an output terminal connected to a multiplexer output terminal;

for each of said pass transistors, a pass transistor control structure comprising:

a first NMOS transistor having one current carrying terminal connected to ground and its gate connected to an output terminal of said first memory cell;

a second NMOS transistor having its gate connected to the complement of said output terminal of said first memory cell;

a PMOS transistor having its gate connected to said output terminal of said first memory cell;

said second NMOS transistor and said PMOS transistor having one current carrying terminal connected to an output terminal of said second memory cell, all three of said transistors having another current carrying terminal connected to the gate of said pass transistor;

such that no two of said pass transistor control structures have transistor gates and transistor current carrying terminals connected to the same combination of memory cell output terminals, whereby said memory cells select which of said pass transistors is turned on.

2. A multiplexer as recited in claim 1 wherein the maximum voltage output from said memory cell output terminals exceeds the maximum voltage applied to said pass-transistor input terminals.

3. A multiplexer as recited in claim 2 wherein said maximum voltage output from said memory cell output terminals exceeds the maximum voltage applied to said pass-transistor input terminals by at least a body effected n-channel threshold voltage.

* * * * *